United States Patent
Matano

(10) Patent No.: US 9,160,339 B2
(45) Date of Patent: Oct. 13, 2015

(54) SEMICONDUCTOR DEVICE HAVING CALIBRATION CIRCUIT THAT ADJUSTS IMPEDANCE OF OUTPUT BUFFER

(71) Applicant: PS4 LUXCO S.A.R.L., Luxembourg (LU)

(72) Inventor: Tatsuya Matano, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/845,204

(22) Filed: Mar. 18, 2013

(65) Prior Publication Data

US 2013/0278286 A1   Oct. 24, 2013

(30) Foreign Application Priority Data

Apr. 18, 2012 (JP) .................................. 2012-095044

(51) Int. Cl.
  *H03K 19/003* (2006.01)
  *H03K 19/0175* (2006.01)

(52) U.S. Cl.
  CPC ............................. *H03K 19/017545* (2013.01)

(58) Field of Classification Search
  CPC .................. H03K 19/0005; H03K 19/017545; H03K 17/167; G11C 2207/2254
  USPC ............................... 326/21, 26, 27, 30, 83, 87
  See application file for complete search history.

(56) References Cited

U.S. PATENT DOCUMENTS

| 7,710,143 | B2 | 5/2010 | Jeong et al. | |
| 7,773,440 | B2 | 8/2010 | Kim et al. | |
| 2008/0054937 | A1* | 3/2008 | Kinoshita et al. | 326/30 |
| 2008/0211534 | A1 | 9/2008 | Jeong et al. | |
| 2008/0219068 | A1 | 9/2008 | Kim et al. | |
| 2009/0072855 | A1* | 3/2009 | Ayyapureddi et al. | 326/30 |
| 2012/0212254 | A1* | 8/2012 | Yokou et al. | 326/30 |
| 2012/0217992 | A1* | 8/2012 | Fujisawa | 326/30 |
| 2013/0015880 | A1* | 1/2013 | Haraguchi | 326/30 |
| 2013/0088258 | A1* | 4/2013 | Yokou et al. | 326/30 |

FOREIGN PATENT DOCUMENTS

| JP | 2008-219865 A | 9/2008 |
| JP | 2008-228276 A | 9/2008 |

* cited by examiner

*Primary Examiner* — Don Le

(57) ABSTRACT

Disclosed herein is a device that includes: a data terminal; an output buffer coupled to the data terminal, the output buffer including a first output unit having a plurality of first output transistors of a first conductivity type and a second output unit having a plurality of second output transistors of a second conductivity type; and a calibration circuit including a first code generation unit that generates a first control code that controls an impedance of the first output unit by performing a first calibration operation based on an impedance of a first reference unit and a second code generation unit that generates a second control code that controls an impedance of the second output unit by performing a second calibration operation based on an impedance of a second reference unit. The calibration circuit performs the first and second calibration operations in parallel.

20 Claims, 13 Drawing Sheets

SEMICONDUCTOR DEVICE HAVING CALIBRATION CIRCUIT THAT ADJUSTS IMPEDANCE OF OUTPUT BUFFER

BACKGROUND OF THE INVENTION

1. Field of the Invention

The present invention relates to a semiconductor device, and more particularly relates to a semiconductor device including a calibration circuit that adjusts an impedance of an output buffer.

2. Description of Related Art

In a semiconductor device such as a DRAM (Dynamic Random Access Memory), a calibration circuit that adjusts an impedance of an output buffer is employed in some cases (see Japanese Patent Application Laid-open Nos. 2008-219865 and 2008-228276). The output buffer includes a pull-up output unit and a pull-down output unit, and the impedance of these units is respectively controlled based on a pull-up impedance code and a pull-down impedance code generated by the calibration circuit.

However, in the semiconductor devices described in Japanese Patent Application Laid-open Nos. 2008-219865 and 2008-228276, the pull-up impedance code is generated first, and then the pull-down impedance code is generated based on the pull-up impedance code. Therefore, there has been a problem that it takes a long time to perform a calibration operation.

Particularly, when a time period allocated to the calibration operation is defined by the number of cycles of a clock signal, the time allocated to the calibration operation becomes short as the frequency of the clock signal to be used is high. Therefore, in some cases, the calibration operation may not be completed correctly. Furthermore, in order to perform an adjustment of the impedance with higher accuracy, the number of bits of the impedance code needs to be increased. However, particularly in the semiconductor devices described in Japanese Patent Application Laid-open Nos. 2008-219865 and 2008-228276, the calibration operation may not be completed within a predetermined time period if the number of bits of the impedance code is increased.

Under such circumstances, a semiconductor device that is capable of completing a calibration operation in a shorter time has been desired.

SUMMARY

In one embodiment, there is provided a semiconductor device that includes: a data terminal; an output buffer coupled to the data terminal, the output buffer including a first output unit having a plurality of first output transistors of a first conductivity type and a second output unit having a plurality of second output transistors of a second conductivity type; and a calibration circuit including a first code generation unit that generates a first control code that controls an impedance of the first output unit by performing a first calibration operation based on an impedance of a first reference unit and a second code generation unit that generates a second control code that controls an impedance of the second output unit by performing a second calibration operation based on an impedance of a second reference unit. The calibration circuit performs the first and second calibration operations in parallel.

In another embodiment, there is provided a semiconductor device that includes: a data terminal; first and second power supply lines; a first output unit connected between the first power supply line and the data terminal, an impedance of the first output unit being controlled based on a first control code; a second output unit connected between the second power supply line and the data terminal, an impedance of the second output unit being controlled based on a second control code; a first code generation unit including a first impedance adjustment unit and a first reference transistor connected in series between the first power supply line and the second power supply line, an impedance of the first impedance adjustment unit being controlled based on the first control code, the first impedance adjustment unit generating the first control code such that a potential of a connection point between the first impedance adjustment unit and the first reference transistor matches a reference potential; and a second code generation unit including a second impedance adjustment unit and a second reference transistor connected in series between the first power supply line and the second power supply line, an impedance of the second impedance adjustment unit being controlled based on the second control code, the second impedance adjustment unit generating the second control code such that a potential of a connection point between the second impedance adjustment unit and the second reference transistor matches the reference potential.

In still another embodiment, there is provided a semiconductor device that includes: a data terminal; a calibration terminal; first and second power supply lines; a first output unit connected between the first power supply line and the data terminal, an impedance of the first output unit being controlled based on a first control code; a second output unit connected between the second power supply line and the data terminal, an impedance of the second output unit being controlled based on a second control code; a first code generation unit including a first impedance adjustment unit connected to the calibration terminal, an impedance of the first impedance adjustment unit being controlled based on the first control code, the first impedance adjustment unit generating the first control code such that a potential of the calibration terminal matches a reference potential; and a second code generation unit including a second impedance adjustment unit and a second reference transistor connected in series between the first power supply line and the second power supply line, an impedance of the second impedance adjustment unit being controlled based on the second control code, the second impedance adjustment unit generating the second control code such that a potential of a connection point between the second impedance adjustment unit and the second reference transistor matches the reference potential.

In still another embodiment, there is provided a system that includes: a substrate; a calibration resistor on the substrate; and a semiconductor chip on the substrate. The semiconductor chip includes: a calibration terminal coupled to the calibration resistor; a data terminal; an output buffer coupled to the data terminal, the output buffer including a plurality of first transistors and a plurality of second transistors, the first and second transistors being different in conductivity type from each other, an impedance of the first transistors being controlled in response to first calibration information, an impedance of the second transistors being controlled in response to second calibration information; and a calibration circuit coupled to the calibration terminal, being configured to compare a reference voltage with a first voltage of the calibration terminal to generate a first bias voltage, to compare the reference voltage with a second voltage responsive to the first bias voltage to generate a second bias voltage, to generate the first calibration information in response to the first bias voltage, and to generate the second calibration information in response to the second bias voltage.

According to the present invention, because first and second control codes can be generated in parallel, a calibration operation can be completed in a shorter time. Therefore, even when the frequency of a clock signal to be used is high or the number of bits of a control code is large, it is possible to correctly complete the calibration operation within a predetermined time period.

DETAILED DESCRIPTION OF THE EMBODIMENTS

Prior to explanations of embodiments of the present invention, an outline of a preferred embodiment of the present invention is explained.

A conventional calibration circuit generates a pull-up impedance code based on an impedance of an external resistor connected to a calibration terminal, and then generates a pull-down impedance code based on the generated pull-up impedance code. That is, if the pull-up impedance code is not settled, the pull-down impedance code cannot be generated. On the other hand, in the preferred embodiments of the present invention, generation of the pull-up impedance code and generation of the pull-down impedance code are performed in parallel and in an unrelated manner to each other. Therefore, it is possible to rapidly generate impedance codes, and at the same time, because one impedance code does not exert any influence on the other code, it is possible to generate impedance codes with higher accuracy.

Preferred embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
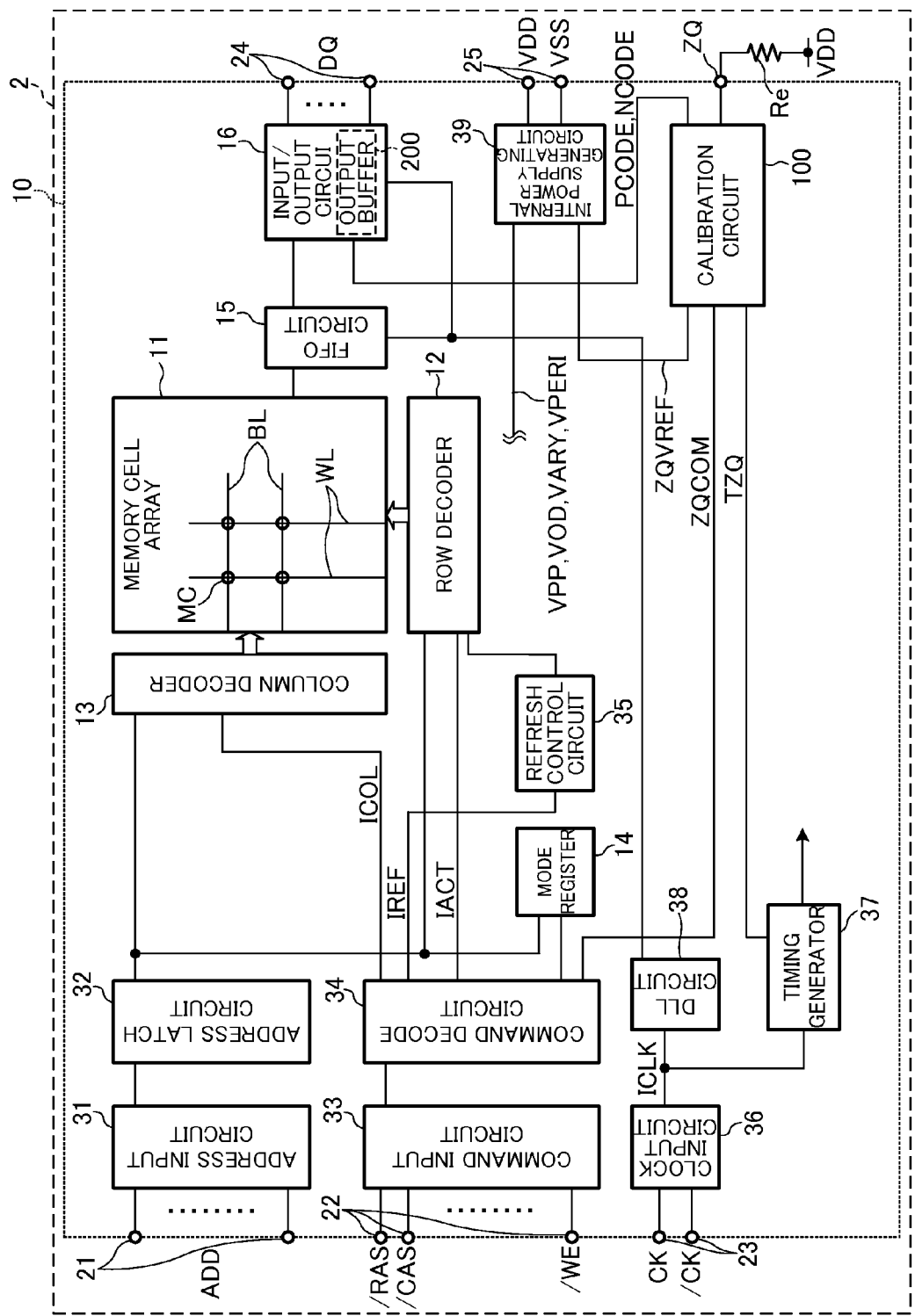
FIG. 1 is a block diagram showing an overall configuration of a semiconductor device according to an embodiment of the present invention.

Referring now to FIG. 1, the semiconductor device 10 according to an embodiment of the present invention is a DRAM integrated in a single semiconductor chip. The semiconductor device 10 is mounted on an external substrate 2 that is a memory module substrate, a mother board or the like. The external substrate 2 employs an external resistor Re that is connected to a calibration terminal ZQ of the semiconductor device 10. The external resistor Re is a reference impedance of the calibration circuit 100 described later. In the present embodiment, a power supply potential VDD is supplied to the external resistor Re.

As shown in FIG. 1, the semiconductor device 10 includes a memory cell array 11. The memory cell array 11 includes a plurality of word lines WL, a plurality of bit lines BL, and a plurality of memory cells MC arranged at their intersections. The selection of the word line WL is performed by a row decoder 12 and the selection of the bit line BL is performed by a column decoder 13. The semiconductor device 10 employs a plurality of external terminals that include address terminals 21, command terminals 22, clock terminals 23, data terminals 24, power supply terminals 25, and the calibration terminal ZQ.

The address terminals 21 are supplied with an address signal ADD from outside. The address signal ADD supplied to the address terminals 21 is transferred via an address input circuit 31 to an address latch circuit 32 that latches the address signal ADD. The address signal ADD latched in the address latch circuit 32 is supplied to the row decoder 12, the column decoder 13, or a mode register 14. The mode register 14 is a circuit in which parameters indicating an operation mode of the semiconductor device 10 are set.

The command terminals 22 are supplied with a command signal CMD from outside. The command signal CMD is constituted by a plurality of signals such as a row-address strobe signal /RAS, a column-address strobe signal /CAS, and a write enable signal /WR. The slash "/" attached to the head of a signal name indicates an inverted signal of a corresponding signal or a low-active signal. The command signal CMD supplied to the command terminal 22 is transferred via a command input circuit 33 to a command decode circuit 34. The command decode circuit 34 decodes the command signal CMD to generate various internal commands that include an active signal IACT, a column signal ICOL, a refresh signal IREF, a mode register set signal MRS, and a calibration signal ZQCODE.

The active signal IACT is activated when the command signal CMD indicates a row access (an active command). When the active signal IACT is activated, the address signal ADD latched in the address latch circuit 32 is supplied to the row decoder 12. The word line WL designated by this address signal ADD is selected accordingly.

The column signal ICOL is activated when the command signal CMD indicates a column access (a read command or a write command). When the column signal ICOL is activated, the address signal ADD latched in the address latch circuit 32 is supplied to the column decoder 13. In this manner, the bit line BL designated by this address signal ADD is selected accordingly.

Accordingly, when the active command and the read command are issued in this order and a row address and a column address are supplied in synchronism with these commands, read data is read from a memory cell MC designated by these row address and column address. Read data DQ is output to outside from the data terminals 24 via an FIFO circuit 15 and an input/output circuit 16. Meanwhile, when the active command and the write command are issued in this order, a row address and a column address are supplied in synchronism with these commands, and then write data DQ is supplied to the data terminals 24, the write data DQ is supplied via the input/output circuit 16 and the FIFO circuit 15 to the memory cell array 11 and written in the memory cell MC designated by these row address and column address. The FIFO circuit 15 and the input/output circuit 16 are operated in synchronism with an internal clock signal LCLK. The internal clock signal LCLK is generated by a DLL circuit 38.

The refresh signal IREF is activated when the command signal CMD indicates a refresh command. When the refresh signal IREF is activated, a row access is made by a refresh control circuit 35 and a predetermined word line WL is selected. In this manner, a plurality of memory cells MC connected to the selected word line WL are refreshed. The selection of the word line WL is made by a refresh counter (not shown) included in the refresh control circuit 35.

The mode register set signal MRS is activated when the command signal CMD indicates a mode register set command. Accordingly, when the mode register set command is issued and a mode signal is supplied from the address terminals 21 in synchronism with this command, a set value of the mode register 14 can be overwritten.

The calibration signal ZQCOM is activated when the command signal CMD indicates a calibration command. The calibration command is not only issued in an initial sequence but also issued periodically during a normal operation. The calibration signal ZQCOM activates the calibration circuit 100. The calibration circuit 100 performs a calibration operation in response to the calibration signal ZQCOM thereby an impedance of an output buffer 200 included in the input/output circuit 16 is adjusted. Details of the calibration circuit 100 and the output buffer 200 will be explained later.

A pair of clock terminals 23 is supplied with external clock signals CK and /CK from outside, respectively. These external clock signals CK and /CK are complementary to each other and then transferred to a clock input circuit 36. The clock input circuit 36 generates an internal clock signal ICLK based on the external clock signals CK and /CK. The internal clock signal ICLK is a basic clock signal within the semiconductor device 10. The internal clock signal ICLK is supplied to a timing generator 37 and thus various internal clock signals are generated. The various internal clock signals generated by the timing generator 37 are supplied to circuit blocks such as the address latch circuit 32 and the command decode circuit 34 and define operation timings of these circuit blocks. The internal clock signals generated by the timing generator 37 include an update timing signal TZQ that is supplied to the calibration circuit 100. The internal clock signal ICLK is also supplied to the DLL circuit 38 thereby the internal clock signal LCLK is generated.

The power supply terminals 25 are supplied with power supply potentials VDD and VSS. These power supply potentials VDD and VSS are supplied to an internal voltage generating circuit 39. The internal power supply generating circuit 39 generates various internal potentials VPP, VOD, VARY, VPERI, and the like and a reference potential ZQVREF based on the power supply potentials VDD and VSS. The internal potential VPP is mainly used in the row decoder 12, the internal potentials VOD and VARY are mainly used in sense amplifiers included in the memory cell array 11, and the internal potential VPERI is used in many other circuit blocks.

On the other hand, the reference potential ZQVREF is a reference potential used in the calibration circuit 100. The reference potential ZQVREF is a reference potential for determining the logical value of the input/output data DQ, which has a level that is switchable according to the operation mode. For example, when the logical value of the input/output data DQ is determined based on VDD/2, the level of the reference potential ZQVREF is also set to VDD/2, and when the logical value of the input/output data DQ is determined based on 0.8 VDD, the level of the reference potential ZQVREF is also set to 0.8 VDD.

Figure 2:
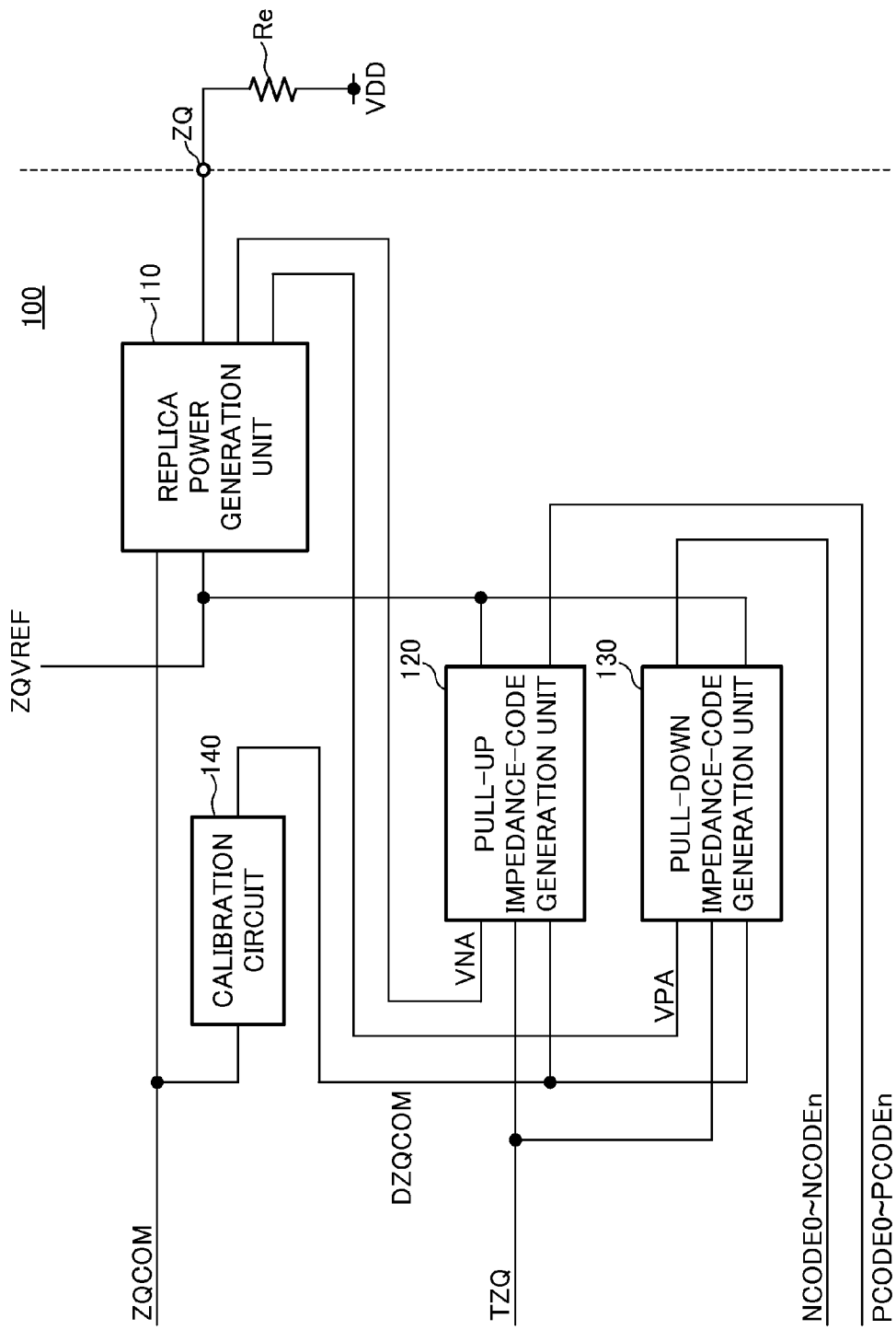
FIG. 2 is a block diagram of a calibration circuit according to a first embodiment of the present invention.

Turning to FIG. 2, the calibration circuit 100 according to the first embodiment of the present invention includes a replica power generation unit 110, a pull-up impedance-code generation unit 120, and a pull-down impedance-code generation unit 130. The replica power generation unit 110 is a circuit that generates bias potentials VNA and VPA, which are control signals, based on the reference potential ZQVREF. The bias potential VNA is supplied to the pull-up impedance-code generation unit 120, and the bias potential VPA is supplied to the pull-down impedance-code generation unit 130. Although these units 110, 120, and 130 are activated based on the calibration signal ZQCOM, in order to secure a time for the bias potentials VNA and VPA to be stabilized, the pull-up impedance-code generation unit 120 and the pull-down impedance-code generation unit 130 are activated in response to the calibration signal ZQCOM that is delayed by a delay circuit 140.

Figure 3:
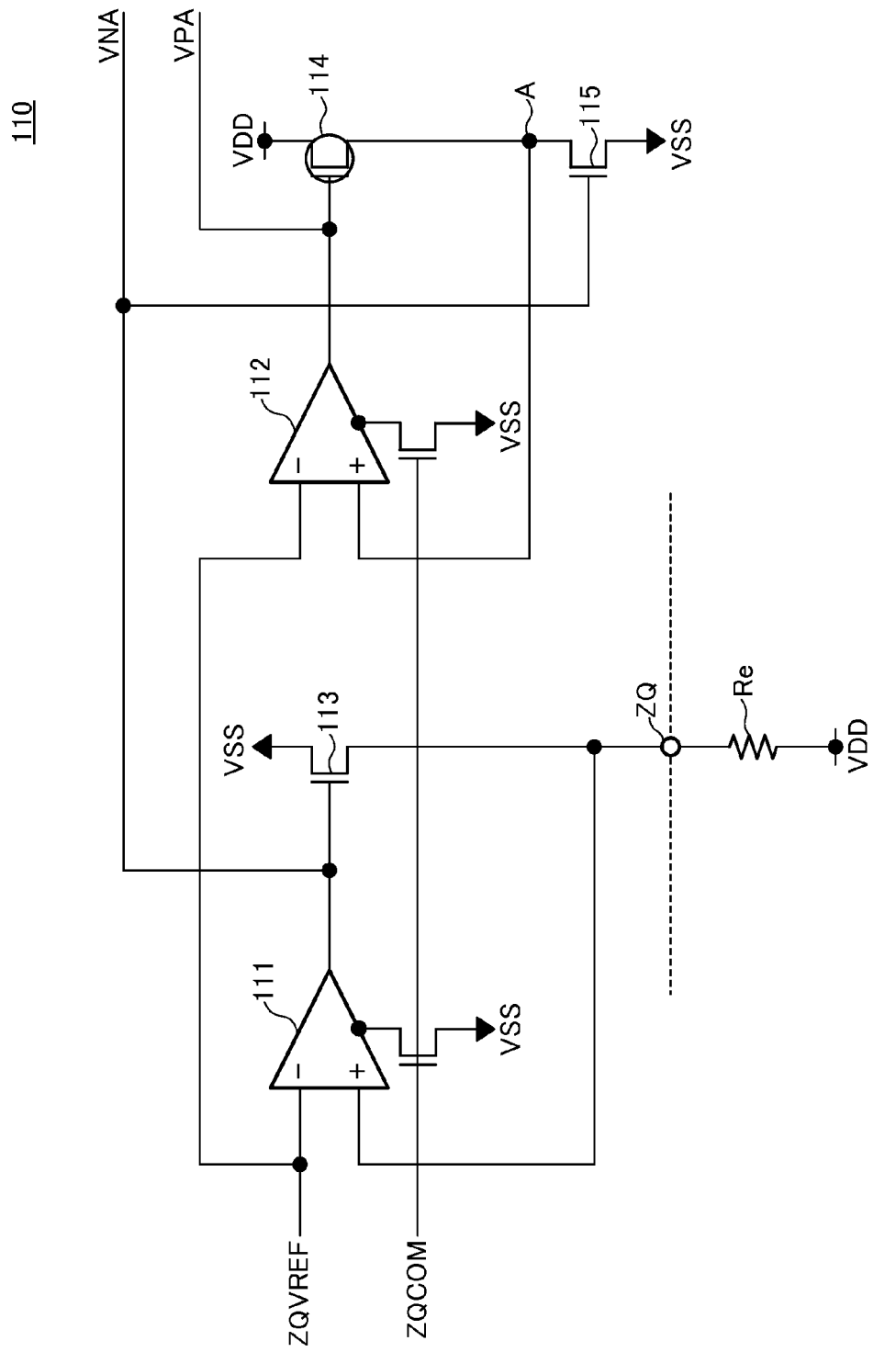
FIG. 3 is a circuit diagram of the replica power generation unit shown in FIG. 2.

Turning to FIG. 3, the replica power generation unit 110 includes comparison circuits 111 and 112. The comparison circuit 111 generates the bias potential VNA by comparing a potential appearing at the calibration terminal ZQ and the reference potential ZQVREF. More specifically, the reference potential ZQVREF is supplied to an inverting input node (−) of the comparison circuit 111, and a non-inverting input node (+) of the comparison circuit 111 is connected to the calibration terminal ZQ. An output node of the comparison circuit 111 is connected to a gate electrode of a bias transistor 113. The bias transistor 113 is an N-channel MOS transistor that is connected between a power supply line to which the ground potential VSS is supplied and the calibration terminal ZQ. Whit this configuration, the impedance of the bias transistor 113 is controlled such that the potential appearing at the calibration terminal ZQ matches the reference potential ZQVREF.

The comparison circuit 112 generates the bias potential VPA by comparing a potential appearing at an intermediate node A and the reference potential ZQVREF. More specifically, the reference potential ZQVREF is supplied to an inverting input node (−) of the comparison circuit 112, and a non-inverting input node (+) of the comparison circuit 112 is connected to the intermediate node A. An output of the comparison circuit 112 is connected to a gate electrode of a bias transistor 114. The bias transistor 114 is a P-channel MOS transistor that is connected between a power supply line to which the power supply potential VDD is supplied and the intermediate node A. Furthermore, a bias transistor 115 constituted by an N-channel MOS transistor is connected between the intermediate node A and the power supply line to which the ground potential VSS is supplied, and the bias potential VNA is supplied to a gate electrode of the bias transistor 115. With this configuration, the impedance of the bias transistor 114 is controlled such that the potential appearing at the intermediate node A matches the reference potential ZQVREF.

These comparison circuits 111 and 112 are activated based on the calibration signal ZQCOM. Therefore, the current consumption by the replica power generation unit 110 is reduced during a time period in which a calibration operation is not performed.

In this manner, in the first embodiment, the bias potentials VNA and VPA that are independent from each other are generated and respectively supplied to the pull-up impedance-code generation unit 120 and the pull-down impedance-code generation unit 130. This means that the pull-up impedance-code generation unit 120 and the pull-down impedance-code generation unit 130 can perform their operations independently from each other.

Figure 4:
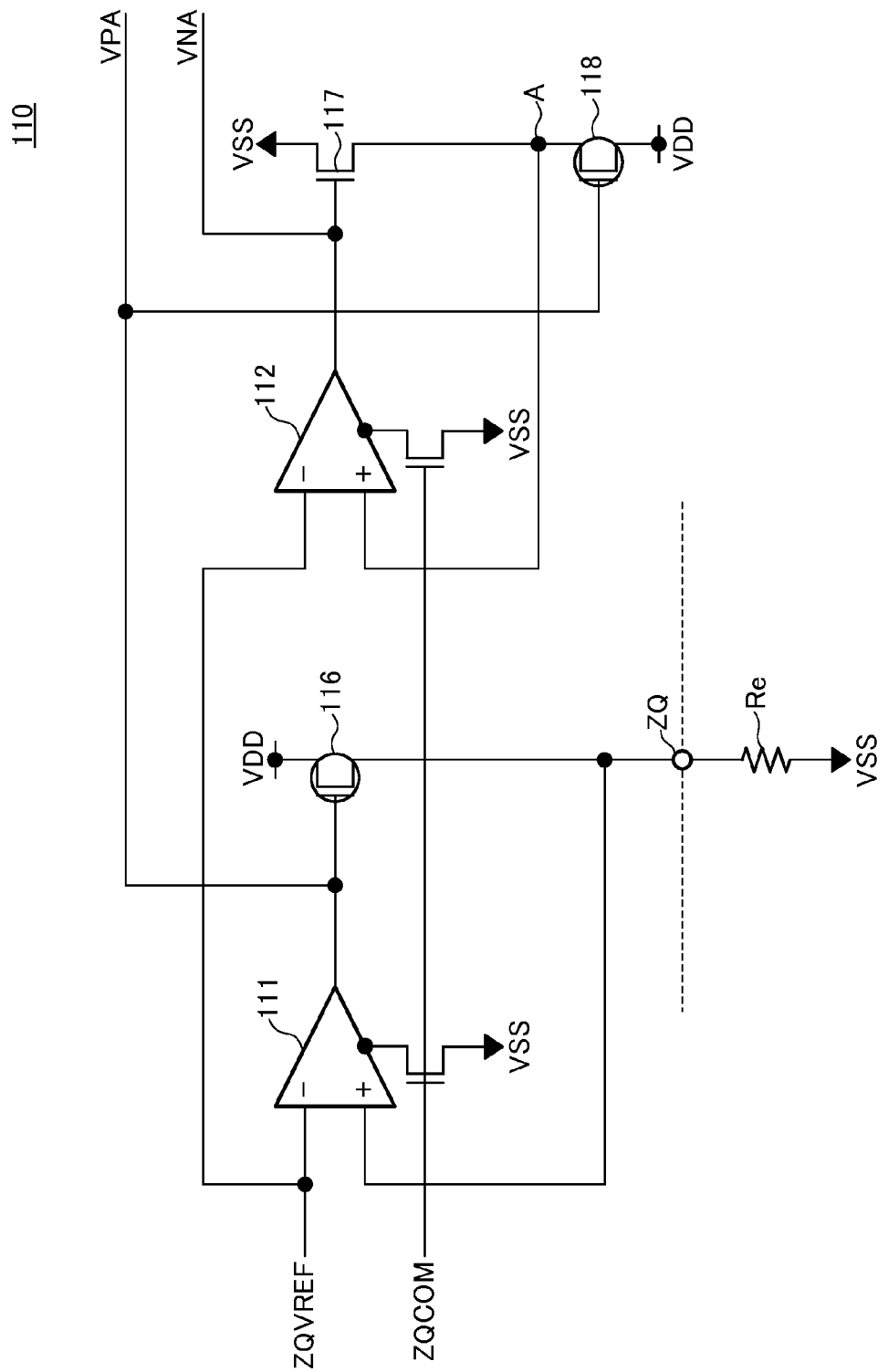
FIG. 4 is a modified circuit diagram of the replica power generation unit shown in FIG. 2.

The replica power generation unit 110 can be configured as shown in FIG. 4. The replica power generation unit 110 shown in FIG. 4 includes bias transistors 116 to 118 instead of the bias transistors 113 to 115 shown in FIG. 3. The bias transistors 116 and 118 are P-channel MOS transistors. The bias transistor 117 is an N-channel MOS transistors. According to this configuration, the bias potential VPA is generated based on the external resistor Re and the bias potential VNA is generated based on the bias potential VPA whereas in FIG. 3 the bias potential VNA is generated based on the external resistor Re and the bias potential VPA is generated based on the bias potential VNA.

Figure 5:
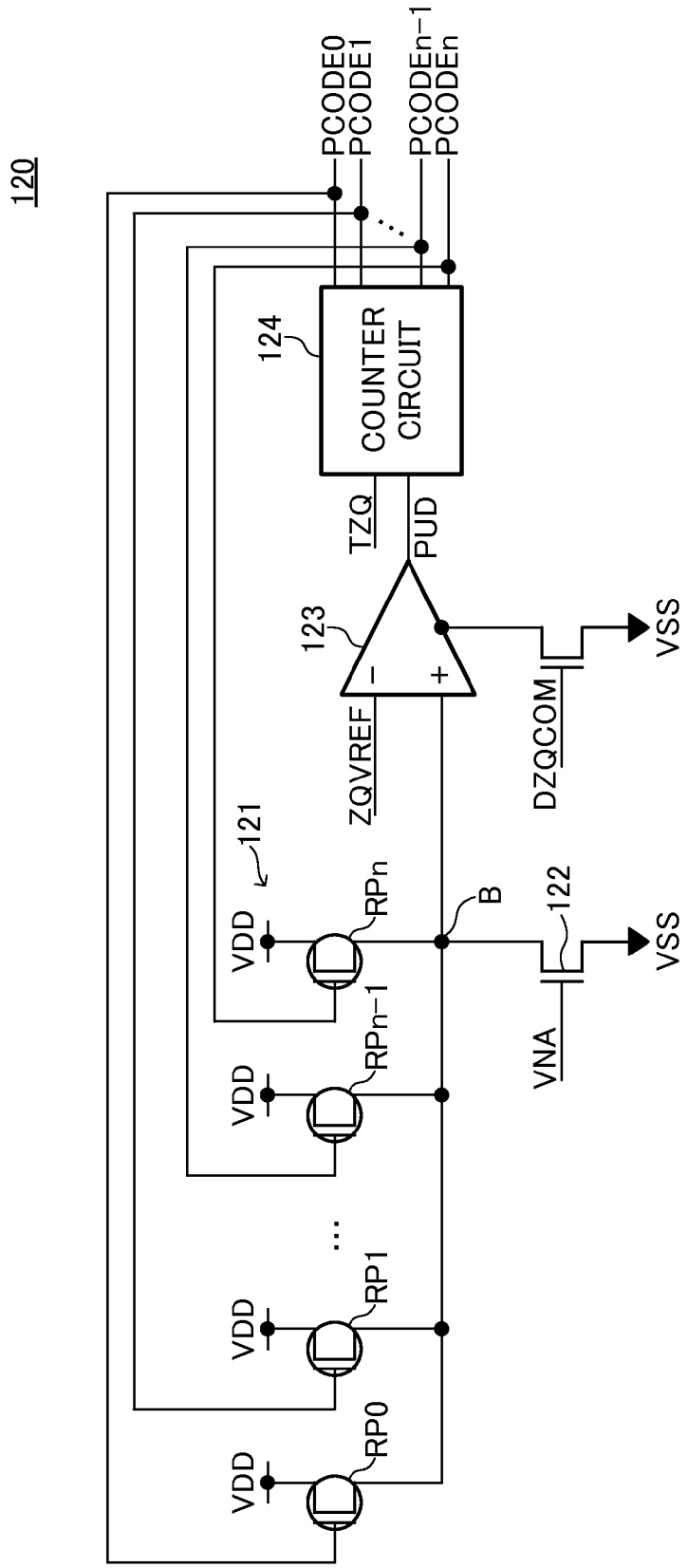
FIG. 5 is a circuit diagram of the pull-up impedance-code generation unit shown in FIG. 2.

Turning to FIG. 5, the pull-up impedance-code generation unit 120 includes an impedance adjustment unit 121 and a reference transistor 122 that are connected in series between the power supply line to which the power supply potential VDD is supplied and the power supply line to which the ground potential VSS is supplied. The impedance adjustment unit 121 is a replica circuit of a pull-up output unit (described later) included in the output buffer 200, and is constituted by a plurality of P-channel MOS transistors RP0 to RPn that are connected in parallel. The respective pull-up impedance codes PCODE0 to PCODEn are supplied to gate electrodes of the transistors RP0 to RPn, by which the transistors RP0 and RPn are on/off controlled individually. In the present specification, the pull-up impedance codes PCODE0 to PCODEn are also referred to as "first control code(s)".

Meanwhile, the reference transistor 122 is constituted by an N-channel MOS transistor having substantially the same characteristics as those of the bias transistor 113, and the bias potential VNA is supplied to a gate electrode of the reference transistor 122. The reference transistor 122 functions as a first reference unit that defines an impedance between the power supply line to which the ground potential VSS is supplied and a connection node B. As shown in FIG. 5, a potential of the connection node B that connects the impedance adjustment unit 121 and the reference transistor 122 is compared with the reference potential ZQVREF by a comparison circuit 123. An up-down signal PUD generated as a result of the comparison is supplied to a counter circuit 124. The counter circuit 124 is a circuit that performs counting up or counting down based on the up-down signal PUD, and its count value is used as the pull-up impedance codes PCODE0 to PCODEn. Updating of the count value is performed in synchronization with the update timing signal TZQ.

Therefore, when the comparison circuit 123 is activated based on a calibration signal DZQCOM, the count value of the counter circuit 124 is updated every time the update timing signal TZQ is activated. With this configuration, the impedance of the impedance adjustment unit 121 is controlled such that the potential of the connection node B matches the reference potential ZQVREF. In the present specification, the pull-up impedance-code generation unit 120 is also referred to as "first code generation unit".

Figure 6:
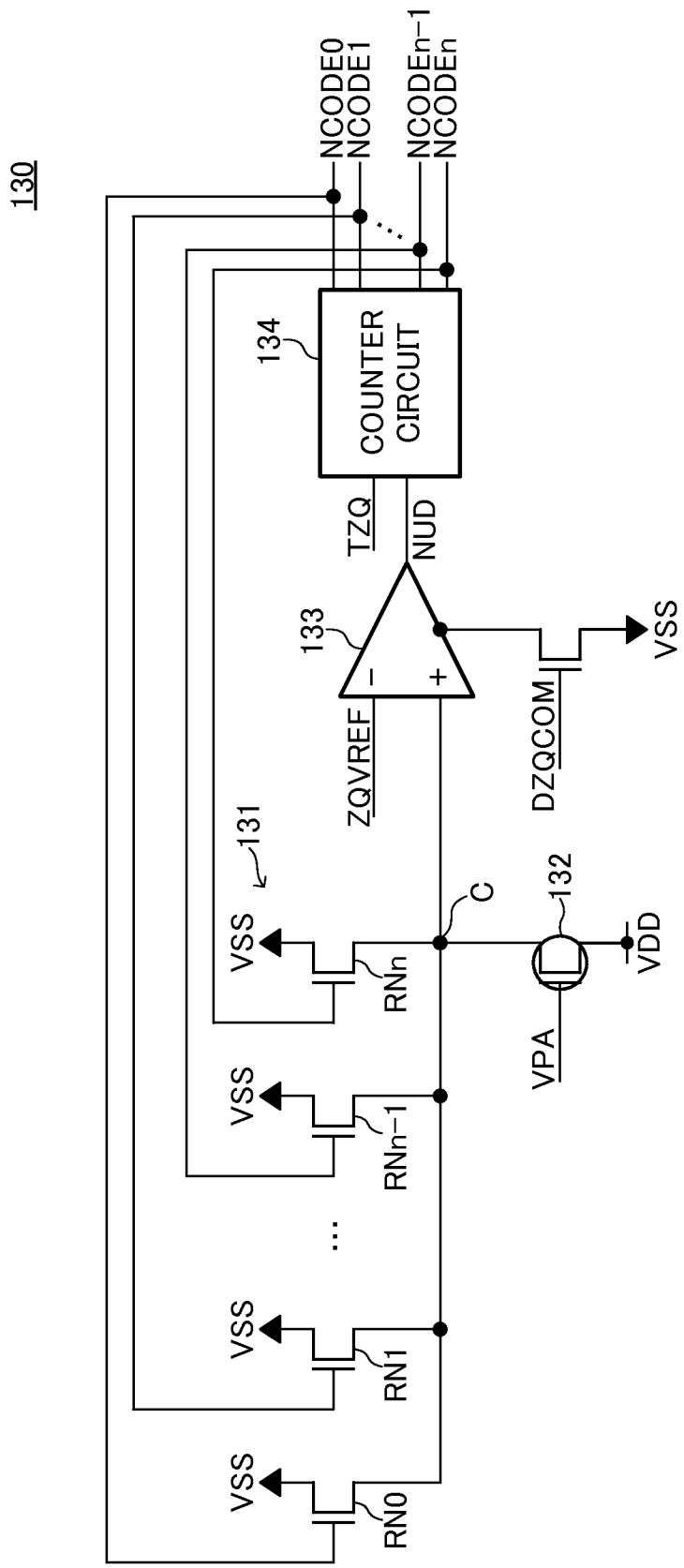
FIG. 6 is a circuit diagram of the pull-down impedance-code generation unit shown in FIG. 2.

Turning to FIG. 6, the pull-down impedance-code generation unit 130 includes an impedance adjustment unit 131 and a reference transistor 132 that are connected in series between the power supply line to which the ground potential VSS is supplied and the power supply line to which the power supply potential VDD is supplied. The impedance adjustment unit 131 is a replica circuit of a pull-down output unit (described later) included in the output buffer 200, that is constituted by a plurality of N-channel MOS transistors RN0 to RNn that are connected in parallel. The respective pull-down impedance codes NCODE0 to NCODEn are supplied to gate electrodes of the transistors RN0 to RNn, by which the transistors RN0 and RNn are on/off controlled individually. In the present specification, the pull-down impedance codes NCODE0 to NCODEn are also referred to as "second control code(s)".

Meanwhile, the reference transistor 132 is constituted by an P-channel MOS transistor having substantially the same characteristics as those of the bias transistor 114, and the bias potential VPA is supplied to a gate electrode of the reference transistor 132. The reference transistor 132 functions as a second reference unit that defines an impedance between the power supply line to which the power supply potential VDD is supplied and a connection node C. As shown in FIG. 6, a potential of the connection node C that connects the impedance adjustment unit 131 and the reference transistor 132 is compared with the reference potential ZQVREF by a comparison circuit 133. An up-down signal NUD generated as a result of the comparison is supplied to a counter circuit 134. The counter circuit 134 is a circuit that performs counting up or counting down based on the up-down signal NUD, and its count value is used as the pull-down impedance codes NCODE0 to NCODEn. Updating of the count value is performed in synchronization with the update timing signal TZQ.

Therefore, when the comparison circuit 133 is activated based on the calibration signal DZQCOM, the count value of the counter circuit 134 is updated every time the update timing signal TZQ is activated. With this configuration, the impedance of the impedance adjustment unit 131 is controlled such that the potential of the connection node C matches the reference potential ZQVREF. In the present specification, the pull-down impedance-code generation unit 130 is also referred to as "second code generation unit".

Figure 7:
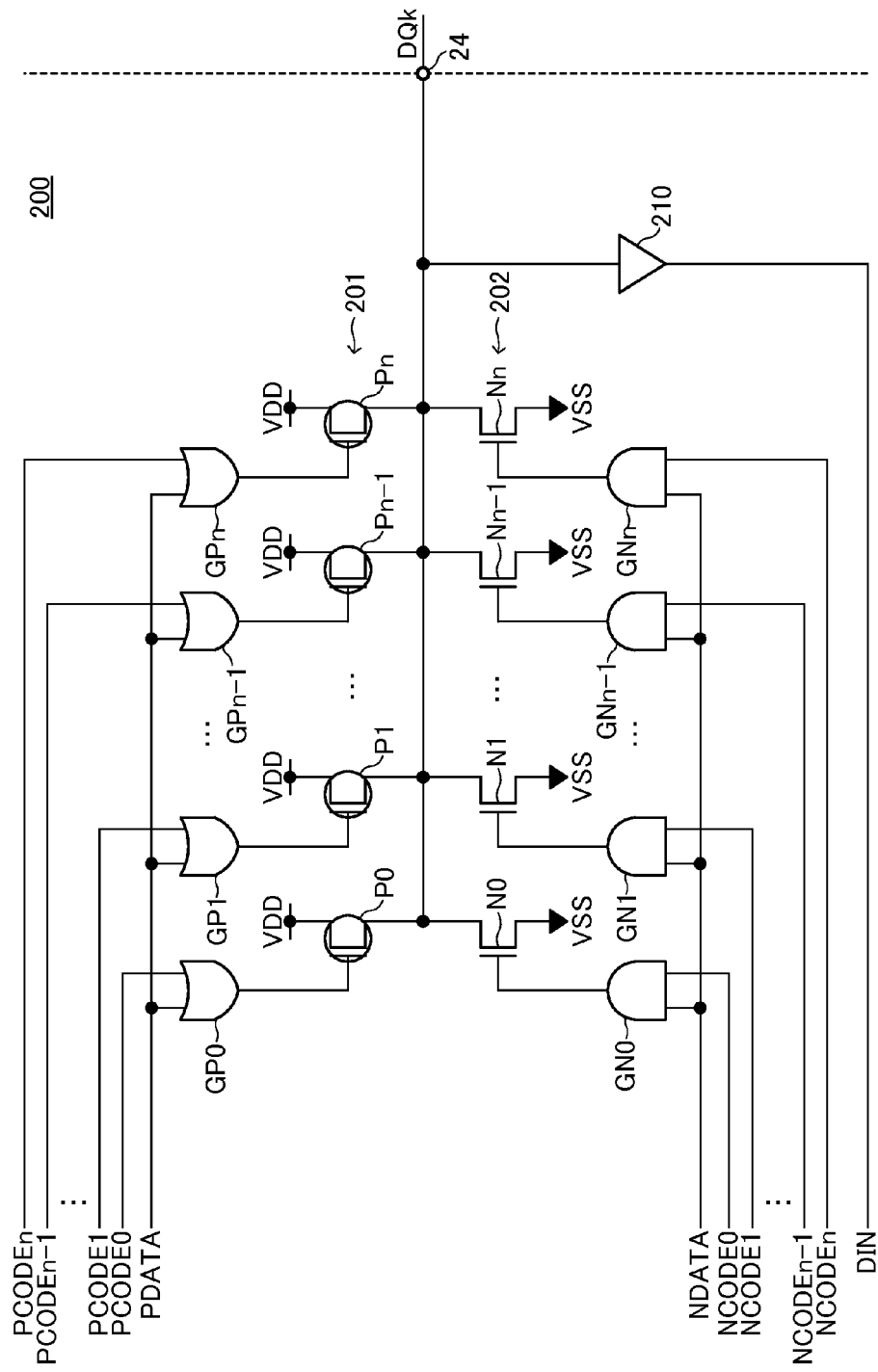
FIG. 7 is a circuit diagram showing a part of the output buffer according to the first embodiment of the present invention.

A part of the output buffer 200 corresponding to the first embodiment is shown in FIG. 7. A unit buffer shown in FIG. 7 is a unit buffer corresponding to input/output data DQk among a plurality of unit buffers included in the output buffer 200. Therefore, in practice, there are as many unit buffers shown in FIG. 7 as the number of the data terminals 24.

As shown in FIG. 7, the output buffer 200 includes a pull-up output unit 201 that is connected between the power supply line to which the power supply potential VDD is supplied and the data terminal 24 and a pull-down output unit 202 that is connected between the power supply line to which the ground potential VSS is supplied and the data terminal 24. The pull-up output unit 201 is constituted by a plurality of P-channel MOS transistors P0 to Pn that are connected in parallel, and the respective pull-up impedance codes PCODE0 to PCODEn are supplied to gate electrodes of the transistors P0 to Pn via respective OR gate circuits GP0 to GPn. Output data PDATA is commonly supplied to one input nodes of the OR gate circuits GP0 to GPn, and the respective pull-up impedance codes PCODE0 to PCODEn are supplied to the other input nodes. With this configuration, when the output data PDATA is activated to be a low level, the transistors P0 to Pn are on/off controlled individually based on the pull-up impedance codes PCODE0 to PCODEn. In the present specification, the transistors P0 to Pn are also referred to as "first output transistor(s)".

Similarly, the pull-down output unit 202 is constituted by a plurality of N-channel MOS transistors N0 to Nn that are connected in parallel, and the respective pull-down impedance codes NCODE0 to NCODEn are supplied to gate electrodes of the transistors N0 to Nn via respective AND gate circuits GN0 to GNn. Output data NDATA is commonly supplied to one input nodes of the AND gate circuits GN0 to GNn, and the respective pull-down impedance codes NCODE0 to NCODEn are supplied to the other input nodes. With this configuration, when the output data NDATA is activated to be a high level, the transistors N0 to Nn are on/off controlled individually based on the pull-down impedance codes NCODE0 to NCODEn. In the present specification, the transistors N0 to Nn are also referred to as "second output transistor (s)".

The output data PDATA and NDATA are internal signals that become a low level when the read data DQk to be output is at a high level and become a high level when the read data DQk to be output is at a low level. With this configuration, the pull-up output unit 201 is activated when the output data PDATA and NDATA become a low level, and the data terminal 24 is driven to be a high level with an impedance specified by the pull-up impedance code PCODE0 to PCODEn. On the other hand, the pull-down output unit 202 is activated when the output data PDATA and NDATA become a high level, and the data terminal 24 is driven to be a low level with an impedance specified by the pull-down impedance codes NCODE0 to NCODEn.

Furthermore, in a write operation, the write data DQk input to the data terminal 24 is supplied to an input buffer 210. The input buffer 210 generates input data DIN based on the supplied write data DQk, and outputs the generated input data DIN to the FIFO circuit 15 shown in FIG. 1.

As described above, the impedance adjustment unit 121 shown in FIG. 5 is a replica circuit of the pull-up output unit 201, and the same pull-up impedance code PCODE0 to PCODEn are supplied to the impedance adjustment unit 121 and the pull-up output unit 201. Therefore, the pull-up impedance adjusted by the pull-up impedance-code generation unit 120 is reflected as it is in the pull-up output unit 201. Similarly, the impedance adjustment unit 131 shown in FIG. 6 is a replica circuit of the pull-down output unit 202, and the same pull-down impedance codes NCODE0 to NCODEn are supplied to the impedance adjustment unit 131 and the pull-down output unit 202. Therefore, the pull-down impedance adjusted by the pull-down impedance-code generation unit 130 is reflected as it is in the pull-down output unit 202.

An operation of the calibration circuit 100 according to the first embodiment of the present invention will be explained with reference to FIG. 8.

Figure 8:
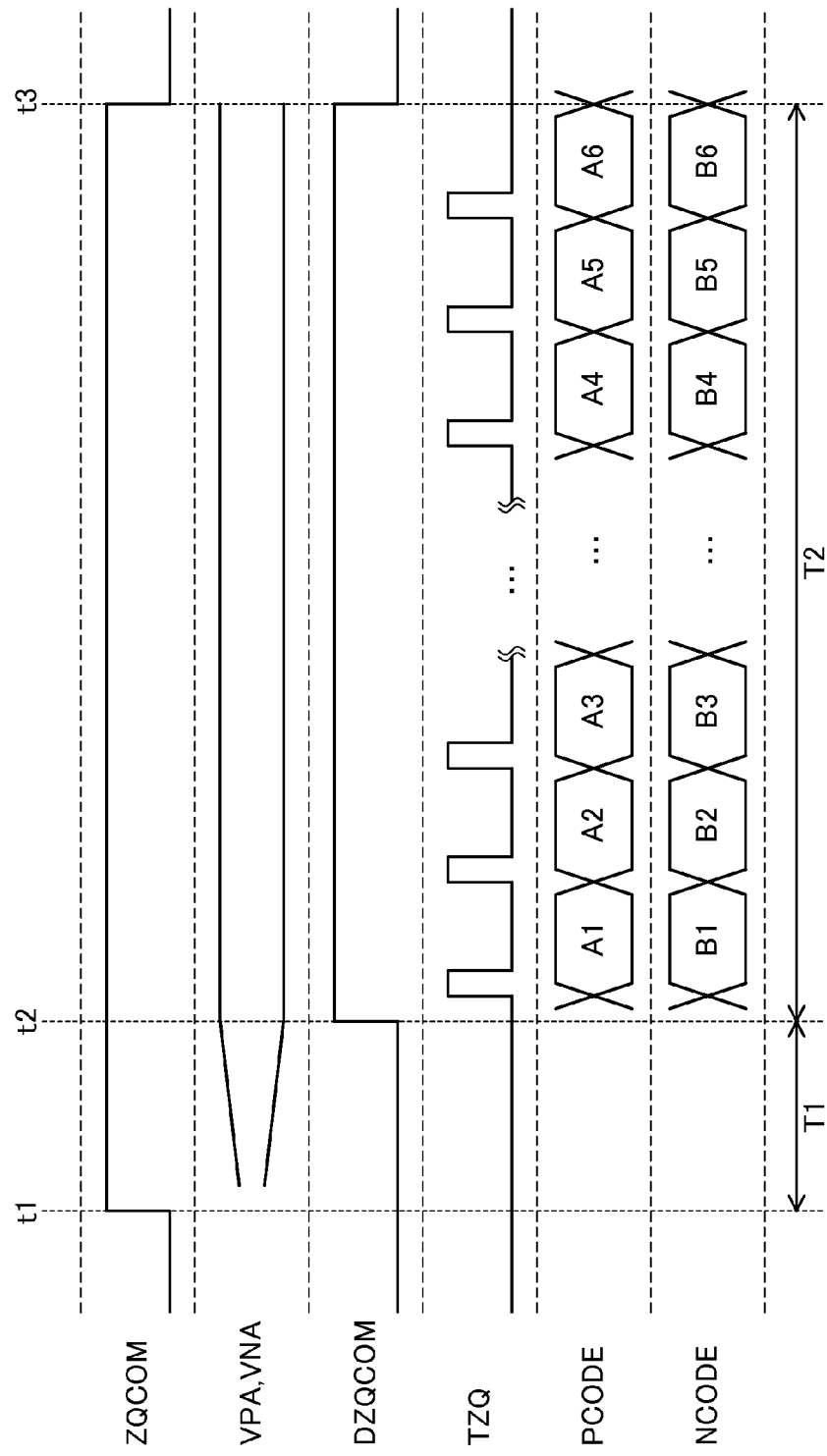
FIG. 8 is a timing diagram for explaining an operation of the calibration circuit according to the first embodiment of the present invention.

In the example shown in FIG. 8, the calibration signal ZQCOM is activated at a time t1. In response to this, the replica power generation unit 110 is activated. However, because it takes a predetermined time for the bias potentials VNA and VPA to be stabilized, in FIG. 8, the bias potentials VNA and VPA are stabilized at a time t2. A time period T1 from the time t1 to the time t2 is a delay time of the delay circuit 140. Therefore, the calibration signal DZQCOM is activated at the time t2. In response to this, the pull-up impedance-code generation unit 120 and the pull-down impedance-code generation unit 130 are activated.

When the calibration signal DZQCOM is activated, the calibration operations by the code generation units 120 and 130 are performed in parallel in synchronization with the update timing signal TZQ. In the example shown in FIG. 8, the count value of the counter circuit 124 is updated to A1, A2, A3, . . . , in synchronization with the update timing signal TZQ, and the count value of the counter circuit 124 becomes A6 at a time t3 at which the calibration signal DZQCOM is deactivated. Similarly, the count value of the counter circuit 134 is updated to B1, B2, B3, . . . , in synchronization with the update timing signal TZQ, and the count value of the counter circuit 134 becomes B6 at the time t3. A time period T2 from the time t2 to the time t3 is a calibration time period in which the calibration operations by the code generation units 120 and 130 are performed in parallel. Therefore, the calibration operation can be completed quickly.

That is, because the time period allocated to the calibration operation is defined by the number of cycles of the external clock signals CK and /CK in most cases, the time allocated to the calibration operation becomes short as the frequencies of the external clock signals CK and /CK to be used are high. However, in the first embodiment, because the calibration operations by the code generation units 120 and 130 are performed in parallel, even when the frequencies of the external clock signals CK and /CK are high, the calibration operation can be completed correctly. Furthermore, in order to perform the impedance adjustment with higher accuracy, the number of bits of the impedance codes PCODE0 to PCODEn and NCODE0 to NCODEn needs to be increased. However, in the first embodiment, even when the number of bits of the impedance codes PCODE0 to PCODEn and NCODE0 to NCODEn is large, the calibration operation can be completed correctly within a predetermined time period. In addition, in the first embodiment, because the calibration operation of one of the code generation units 120 and 130 does not exert any influence on the calibration operation of the other unit, the calibration operations can be accurately performed in parallel.

A second embodiment of the present invention is explained next with reference to FIGS. 8 to 12.

Figure 9:
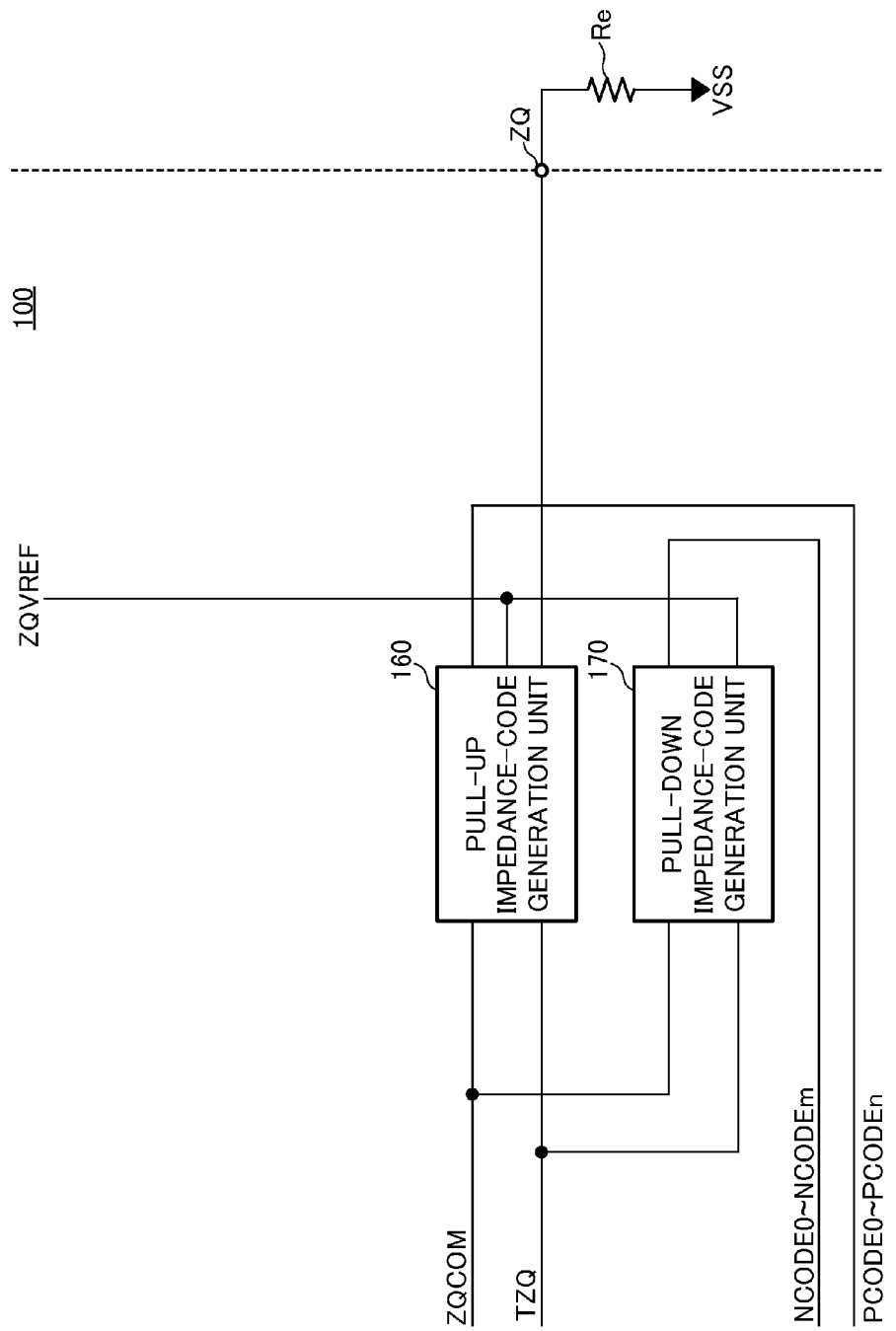
FIG. 9 is a block diagram of the calibration circuit 100 according to a second embodiment of the present invention.

As shown in FIG. 9, the calibration circuit 100 according to the second embodiment includes a pull-up impedance-code generation unit 160 and a pull-down impedance-code generation unit 170. In the second embodiment, the delay circuit 140 and the replica power generation unit 110 shown in FIG. 2 are not included in the calibration circuit 100. Therefore, the calibration circuit 100 according to the second embodiment has characteristics such that its circuit size is smaller and the current consumption is also smaller as compared to the calibration circuit 100 according to the first embodiment.

Figure 10:
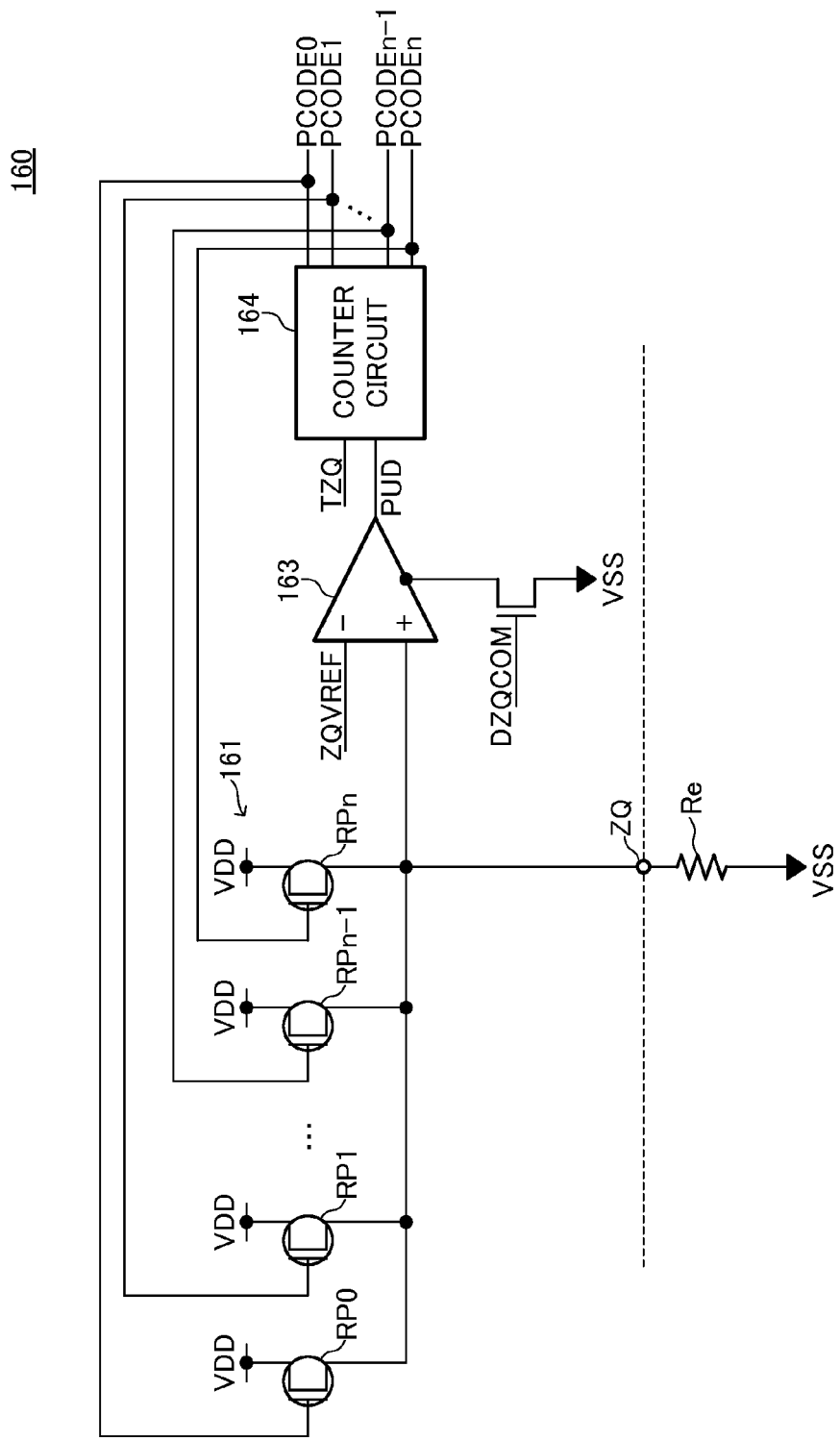
FIG. 10 is a circuit diagram of the pull-up impedance-code generation unit shown in FIG. 9.

Turning to FIG. 10, the pull-up impedance-code generation unit 160 has a circuit configuration similar to that of the pull-up impedance-code generation unit 120 shown in FIG. 5, including an impedance adjustment unit 161 that is connected between the power supply line to which the power supply potential VDD is supplied and the calibration terminal ZQ. In the second embodiment, the calibration terminal ZQ is connected to the ground potential VSS. The reference transistor 122 shown in FIG. 5 is not included in the pull-up impedance-code generation unit 160. The impedance adjustment unit 161 is a replica circuit of the pull-up output unit 201 included in the output buffer 200, having functions similar to those of the impedance adjustment unit 121 shown in FIG. 5.

As shown in FIG. 10, in the second embodiment, the potential of the calibration terminal ZQ is compared with the reference potential ZQVREF by a comparison circuit 163. The up-down signal PUD generated as a result of the comparison is supplied to a counter circuit 164. The counter circuit 164 has functions similar to those of the counter circuit 124 shown in FIG. 5.

Figure 11:
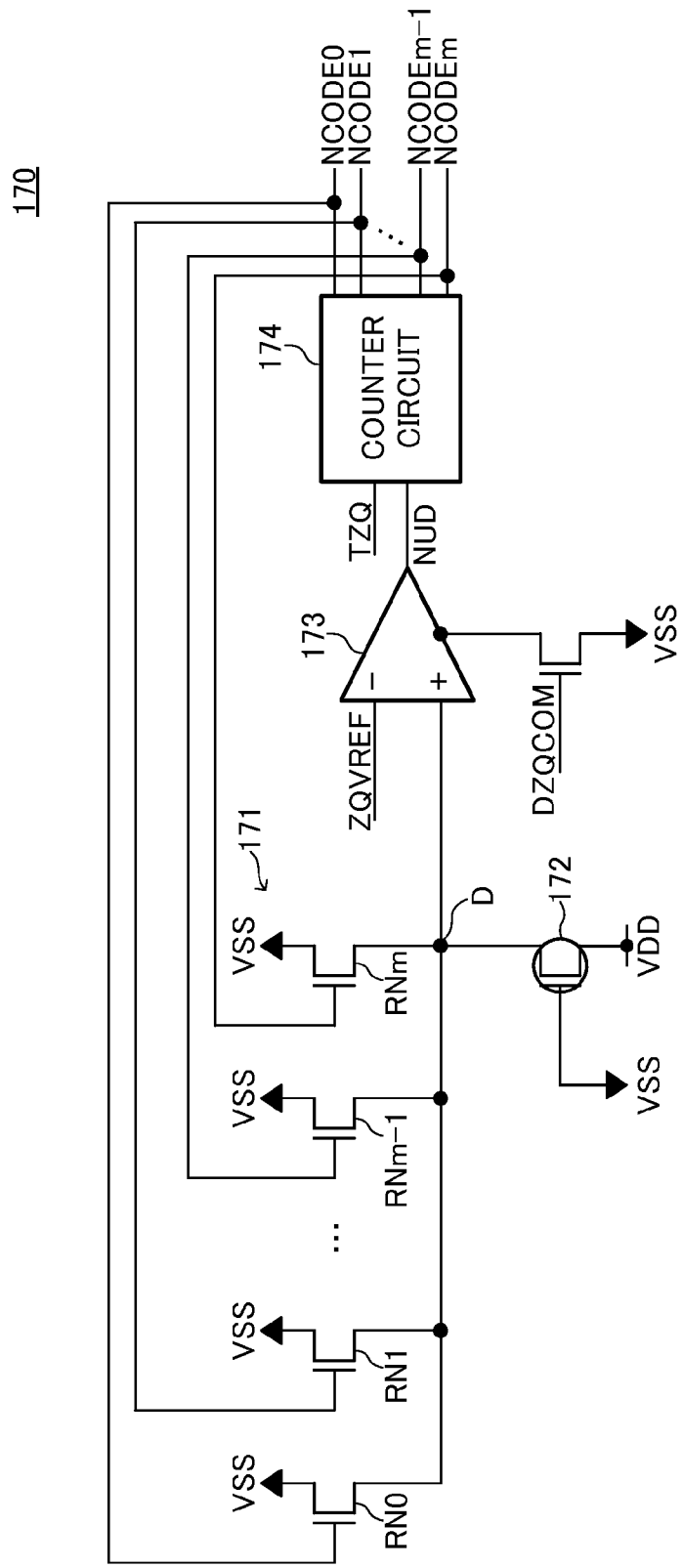
FIG. 11 is a circuit diagram of the pull-down impedance-code generation unit shown in FIG. 9.

Turning to FIG. 11, the pull-down impedance-code generation unit 170 has a circuit configuration similar to that of the pull-down impedance-code generation unit 130 shown in FIG. 6, including an impedance adjustment unit 171 and a reference transistor 172 that are connected in series between the power supply line to which the ground potential VSS is supplied and the power supply line to which the power supply potential VDD is supplied. The impedance adjustment unit 171 is a variable impedance circuit having a target value of an impedance of any one of the P-channel MOS transistors constituting the pull-up output unit, rather than the replica circuit of the pull-down output unit included in the output buffer 200. The impedance adjustment unit 171 is constituted by a plurality of N-channel MOS transistors RN0 to RNm that are connected in parallel. The respective pull-down impedance codes NCODE0 to NCODEn are supplied to gate electrodes of the transistors RN0 to RNm, by which the transistors RN0 to RNm are on/off controlled individually. The number of bits of the pull-down impedance codes (=m) does not need to match the number of bits of the pull-up impedance codes (=n).

The reference transistor 172 is a replica of any one of the P-channel MOS transistors RP0 to RPn constituting the impedance adjustment unit 161 of the pull-up impedance-code generation unit 160. Because the transistors RP0 to RPn are replicas of the P-channel MOS transistors P0 to Pn constituting the pull-up output unit 201, it can be said that the reference transistor 172 is a replica of any one of the P-channel MOS transistors P0 to Pn constituting the pull-up output unit 201.

A gate electrode of the reference transistor 172 is fixed to the ground potential VSS. With this configuration, the reference transistor 172 is in a normally ON state, and the impedance of the reference transistor 172 matches an impedance of any one of the P-channel MOS transistors P0 to Pn constituting the pull-up output unit 201.

As shown in FIG. 11, in the second embodiment, a potential of a connection node D that connects the impedance adjustment unit 171 and the reference transistor 172 is compared with the reference potential ZQVREF by a comparison circuit 173. The up-down signal NUD generated as a result of the comparison is supplied to a counter circuit 174. The counter circuit 174 is a circuit that performs counting up or counting down based on the up-down signal NUD, and its count value is used as the pull-down impedance codes NCODE0 to NCODEm. Updating of the count value is performed in synchronization with the update timing signal TZQ.

Therefore, when the comparison circuit 173 is activated based on the calibration signal DZQCOM, the count value of the counter circuit 174 is updated every time the update timing signal TZQ is activated. With this configuration, the impedance of the impedance adjustment unit 171 is controlled such that the potential of the connection node D matches the reference potential ZQVREF.

Figure 12:
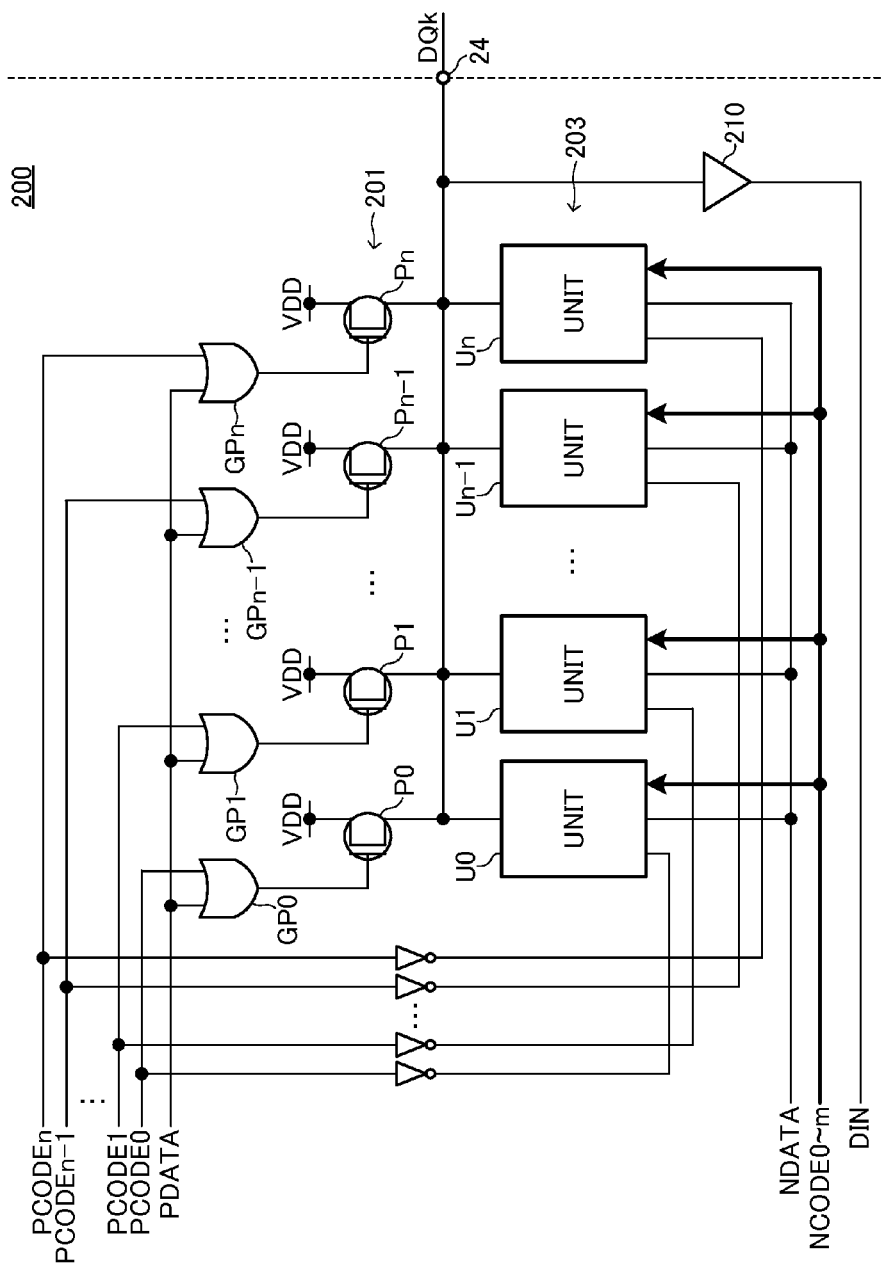
FIG. 12 is a circuit diagram showing a part of the output buffer according to the second embodiment of the present invention.

A part of the output buffer 200 corresponding to the second embodiment is shown in FIG. 12. A unit buffer shown in FIG. 12 is a unit buffer corresponding to the input/output data DQk among a plurality of unit buffers included in the output buffer 200, similarly to that shown in FIG. 7. Therefore, in practice, there are as many unit buffers shown in FIG. 12 as the number of data terminals 24.

As shown in FIG. 12, the output buffer 200 according to the second embodiment is different from the output buffer 200 shown in FIG. 7 in that the pull-down output unit 202 is replaced by a pull-down output unit 203. The circuit configuration of the pull-up output unit 201 is the same as that shown in FIG. 7. The pull-down output unit 203 is constituted by a plurality of units U0 to Un that are connected in parallel. Each of the units U0 to Un matches an impedance of corresponding one the P-channel MOS transistors P0 to Pn. Therefore, when the impedances of the transistors P0 to Pn are weighted, the impedances of the units U0 to Un are also weighted in the same manner.

Figure 13:
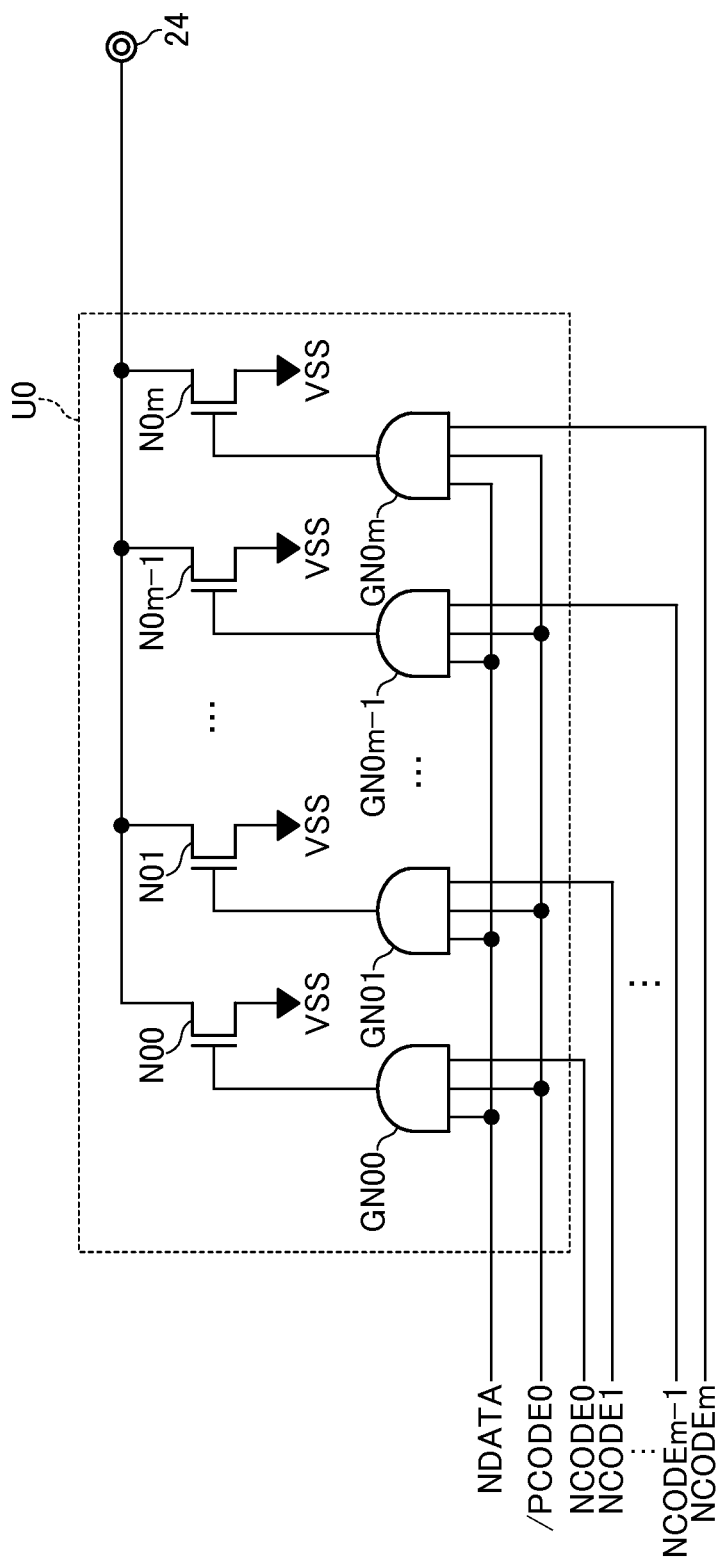
FIG. 13 is a circuit diagram of the unit shown in FIG. 12.

As shown in FIG. 13, the unit U0 includes N-channel MOS transistors N00 to N0m that are connected in parallel between the power supply line to which ground potential VSS and the data terminal 24, and the respective pull-down impedance codes NCODE0 to NCODEm are supplied to gate electrodes of the transistors N00 to N0m via respective AND gate circuits GN00 to GN0m. Each of the AND gate circuits GN00 to GN0m has three inputs including a first input node to which the output data NDATA is commonly supplied, a second input node to which an inverted signal of the pull-up impedance code PCODE0 is commonly supplied, and a third input node to which corresponding one of the pull-down impedance codes NCODE0 to NCODEm is supplied. With this configuration, when the output data NDATA and the inverted signal of the pull-up impedance code PCODE0 are activated to a high level, the transistors N00 to N0m are on/off controlled individually based on the pull-down impedance codes NCODE0 to NCODEm.

Other units U1 to Un have the same circuit configuration as that of the unit U0 shown in FIG. 13, except that inverted signals of the respective pull-up impedance code PCODE1 to PCODEn are supplied. With this configuration, when the output data NDATA becomes a high level, a unit to be activated is selected from the units U0 to Un based on the pull-up impedance code PCODE1 to PCODEn, and transistors Ni0 to Nim (i=0 to n) included in the activated units among the units U0 to Un are activated based on the pull-down impedance codes NCODE0 to NCODEm.

With this configuration, because the impedance of the pull-down output unit 203 matches the impedance of the pull-up output unit 201, it is possible to achieve the same effect as the first embodiment. That is, the calibration operation by the pull-up impedance-code generation unit 160 and the calibration operation by the pull-down impedance-code generation unit 170 can be performed in parallel and in an unrelated manner to each other.

It is apparent that the present invention is not limited to the above embodiments, but may be modified and changed without departing from the scope and spirit of the invention.

For example, in the embodiments described above, the calibration operations by the pull-up impedance-code generation units 120 and 160 and the calibration operations by the pull-down impedance-code generation units 130 and 170 are started at the same time and are completed at the same time. However, the present invention is not limited to this configuration, and it suffices as the time periods for the calibration operations are at least partially overlapped with each other.

Furthermore, although the external resistor Re is connected to the power supply potential VDD in the first embodiment, the external resistor Re can be connected to the ground potential VSS. The external resistor Re is connected to the power supply potential VDD in the first embodiment in order to generate the bias potential VNA based on the external resistor Re and to generate the bias potential VPA based on the generated bias potential VNA. Therefore, conversely, it suffices as the external resistor Re are connected to the ground potential VSS, so long as the bias potential VPA is generated based on the external resistor Re and the bias potential VNA is generated based on the generated bias potential VPA.

In addition, while not specifically claimed in the claim section, the applicant reserves the right to include in the claim section of the application at any appropriate time the following semiconductor devices:

A1. A semiconductor device comprising:
a data terminal;
a calibration terminal;
first and second power supply lines;
a first output unit connected between the first power supply line and the data terminal, an impedance of the first output unit being controlled based on a first control code;
a second output unit connected between the second power supply line and the data terminal, an impedance of the second output unit being controlled based on a second control code;
a first code generation unit including a first impedance adjustment unit connected to the calibration terminal, an impedance of the first impedance adjustment unit being controlled based on the first control code, the first impedance adjustment unit generating the first control code such that a potential of the calibration terminal matches a reference potential; and
a second code generation unit including a second impedance adjustment unit and a second reference transistor connected in series between the first power supply line and the second power supply line, an impedance of the second impedance adjustment unit being controlled based on the second control code, the second impedance adjustment unit generating the second control code such that a potential of a connection point between the second impedance adjustment unit and the second reference transistor matches the reference potential.

A2. The semiconductor device as described in A1, wherein
the first output unit includes a plurality of first output transistors that are connected in parallel between the first power supply line and the data terminal,
the second output unit includes a plurality of units that are connected in parallel between the second power supply line and the data terminal,
each of the units includes a plurality of second output transistors that are connected in parallel between the second power supply line and the data terminal,
each of the first output transistors is activated based on a corresponding bit of the first control code,
each of the units is activated based on a corresponding bit of the first control code, and
each of the second transistors is activated based on a corresponding bit of the second control code.

A3. The semiconductor device as described in A2, wherein
the second reference transistor is a replica of one of the first output transistors, and
a control electrode of the second reference transistor is connected to the second power supply line.

What is claimed is:

1. A semiconductor device comprising:
a data terminal;
an output buffer coupled to the data terminal, the output buffer including a first output unit having a plurality of first output transistors of a first conductivity type and a second output unit having a plurality of second output transistors of a second conductivity type; and
a calibration circuit including a first code generation unit that generates a first control code that controls an impedance of the first output unit by performing a first calibration operation based on an impedance of a first reference unit and a second code generation unit that generates a second control code that controls an impedance of the second output unit by performing a second calibration operation based on an impedance of a second reference unit,
wherein the calibration circuit performs the first and second calibration operations in parallel.

2. The semiconductor device as claimed in claim 1, wherein
the calibration circuit further includes a replica power generation unit, and
the replica power generation unit supplies a first control signal to the first reference unit to control the impedance of the first reference unit, and supplies a second control signal to the second reference unit to control the impedance of the second reference unit.

3. The semiconductor device as claimed in claim 2, wherein
each of the first output transistors is activated based on a corresponding bit of the first control code, and
each of the second output transistors is activated based on a corresponding bit of the second control code.

4. The semiconductor device as claimed in claim 1, wherein
the first reference unit is connected to a calibration terminal that is to be connected to the first reference unit, and
the second reference unit includes a replica transistor that is a replica of one of the first output transistors, the replica transistor controls the impedance of the second reference unit.

5. The semiconductor device as claimed in claim 4, wherein the impedance of the second output unit is adjusted based on both the first and second control codes.

6. The semiconductor device as claimed in claim 5, wherein
each of the first output transistors is activated based on a corresponding bit of the first control code, and
the second output transistors are grouped into a plurality of units, each of the units is activated based on a corresponding bit of the first control code, and each of the second output transistors included in activated one or ones of units is activated based on a corresponding bit of the second control code.

7. The semiconductor device as claimed in claim 1, wherein
the first and second reference units include first and second reference transistors, respectively,
the impedances of the first and second reference units are defined by impedances of the first and second reference transistors, respectively,
the first reference transistor is of the second conductivity type, and
the second reference transistor is of the first conductivity type.

8. The semiconductor device as claimed in claim 7, wherein
the calibration circuit further includes a replica power generation unit that generates first and second bias potentials,
the first bias potential is supplied to a control electrode of the first reference transistor, and
the second bias potential is supplied to a control electrode of the second reference transistor.

9. The semiconductor device as claimed in claim 8, further comprising a calibration terminal, wherein
the replica power generation unit includes:
a first comparison circuit generating the first bias potential by comparing a potential appearing at the calibration terminal with a reference potential; and a first bias transistor connected between a second power supply line and the calibration terminal, the first bias potential being supplied to a control electrode of the first bias transistor, and the first bias transistor is of the second conductivity type.

10. The semiconductor device as claimed in claim 9, wherein the replica power generation unit further includes:
a second comparison circuit generating the second bias potential by comparing a potential appearing at a connection node with the reference potential;
a second bias transistor connected between a first power supply line and the connection node, the second bias potential being supplied to a control electrode of the second bias transistor; and
a third bias transistor connected between the second power supply line and the connection node, the first bias potential being supplied to the control electrode of the third bias transistor, the second bias transistor is of the first conductivity type, and the third bias transistor is of the second conductivity type.

11. A semiconductor device comprising:
a data terminal;
first and second power supply lines;
a first output unit connected between the first power supply line and the data terminal, an impedance of the first output unit being controlled based on a first control code;
a second output unit connected between the second power supply line and the data terminal, an impedance of the second output unit being controlled based on a second control code;
a first code generation unit including a first impedance adjustment unit and a first reference transistor connected in series between the first power supply line and the second power supply line, an impedance of the first impedance adjustment unit being controlled based on the first control code, the first impedance adjustment unit generating the first control code such that a potential of a connection point between the first impedance adjustment unit and the first reference transistor matches a reference potential; and
a second code generation unit including a second impedance adjustment unit and a second reference transistor connected in series between the first power supply line and the second power supply line, an impedance of the second impedance adjustment unit being controlled based on the second control code, the second impedance adjustment unit generating the second control code such that a potential of a connection point between the second impedance adjustment unit and the second reference transistor matches the reference potential.

12. The semiconductor device as claimed in claim 11, further comprising a replica power generation unit that generates first and second bias potentials, wherein the first bias potential is supplied to a control electrode of the first reference transistor, and the second bias potential is supplied to a control electrode of the second reference transistor.

13. The semiconductor device as claimed in claim 12, wherein the first output unit includes a plurality of first output transistors that are connected in parallel between the first power supply line and the data terminal, the second output unit includes a plurality of second output transistors that are connected in parallel between the second power supply line and the data terminal, each of the first output transistors is activated based on a corresponding bit of the first control code, and each of the second output transistors is activated based on a corresponding bit of the second control code.

14. A system comprising:
a substrate;
a calibration resistor on the substrate; and
a semiconductor chip on the substrate, the semiconductor chip comprising:
a calibration terminal coupled to the calibration resistor;
a data terminal;
an output buffer coupled to the data terminal, the output buffer including a plurality of first transistors and a plurality of second transistors, the first and second transistors being different in conductivity type from each other, an impedance of the first transistors being controlled in response to first calibration information, an impedance of the second transistors being controlled in response to second calibration information; and
a calibration circuit coupled to the calibration terminal, being configured to compare a reference voltage with a first voltage of the calibration terminal to generate a first bias voltage, to compare the reference voltage with a second voltage responsive to the first bias voltage to generate a second bias voltage, to generate the first calibration information in response to the first bias voltage, and to generate the second calibration information in response to the second bias voltage.

15. The system as claimed in claim 14, wherein the calibration circuit comprises a first bias generator that includes:
a first operation amplifier including a first input node supplied with the reference voltage, a second input node coupled to the calibration terminal and a first output node to which the first bias voltage is supplied; and
a third transistor including a first gate coupled to the output node of the first operation amplifier and a first source and a first drain, one of the first source and the first drain being coupled to the calibration terminal.

16. The system as claimed in claim 15, wherein the calibration circuit further comprises a second bias generator that includes:
a second operation amplifier including a third input node supplied with the reference voltage, a fourth input node and a second output node to which the second bias voltage is supplied; and
a fourth transistor including a second gate coupled to the second output node of the second operation amplifier and a second source and a second drain, the fourth transistor being different in conductivity type from the third transistor; and
a fifth transistor including a third gate coupled to the first output node of the first operation amplifier and a third source and a third drain, the fifth transistor being same in conductivity type as the third transistor;
one of the second source and the second drain of the fourth transistor being coupled to each of one of the third source and the third drain of the fifth transistor and the fourth input node of the second operation amplifier.

17. The system as claimed in claim 14, wherein the calibration circuit comprises a first information generator that includes:

a connection node;

a sixth transistor coupled to the connection node, a fourth gate of the sixth transistor supplied with the first bias voltage;

a plurality of seventh transistors coupled in common to the connection node and respectively controlled to turn on or off in response to the first calibration information;

a calibration information generator configured to generate the first calibration information in response to comparing the reference voltage with a voltage of the connection node.

18. The system as claimed in claim 17, wherein the calibration circuit further comprises a second information generator that includes:

an additional connection node;

a seventh transistor coupled to the additional connection node, a fifth gate of the seventh transistor supplied with the second bias voltage;

a plurality of eighth transistors coupled in common to the additional connection node and respectively controlled to turn on or off in response to the second calibration information;

an additional calibration information generator configured to generate the second calibration information in response to comparing the reference voltage with a voltage of the additional connection node.

19. The system as claimed in claim 16, wherein the calibration resistor includes one end coupled to the calibration terminal of the semiconductor chip and the other end coupled to a first voltage terminal supplied with a first voltage, the other of the first source and the first drain of the third transistor is supplied with a second voltage different from the first voltage.

20. The system as claimed in claim 19, wherein the other of the second source and the second drain of the fourth transistor is supplied with the first voltage and the other of the third source and the third drain of the fifth transistor is supplied with the second voltage.

* * * * *